United States Patent [19]

Mooney et al.

[11] Patent Number: 4,568,792

[45] Date of Patent: Feb. 4, 1986

[54] PHOTOVOLTAIC CELL INCLUDING DOPED CADMIUM TELLURIDE, A DISLOCATION PREVENTING AGENT AND IMPROVED OHMIC CONTACTS

[75] Inventors: John B. Mooney, San Jose; Arden Sher, Belmont, both of Calif.

[73] Assignee: SRI International, Menlo, Calif.

[21] Appl. No.: 576,727

[22] Filed: Feb. 2, 1984

[51] Int. Cl.$^4$ .................................................. H01L 31/06
[52] U.S. Cl. ...................................... 136/260; 136/264; 136/265
[58] Field of Search .................. 136/260, 264, 265; 357/30, 11, 61

[56] References Cited

U.S. PATENT DOCUMENTS

| | | | |
|---|---|---|---|
| 3,261,726 | 7/1966 | Ruehrwein | 148/33.4 |
| 4,179,308 | 12/1979 | Olson et al. | 136/262 |
| 4,400,244 | 8/1983 | Kroger et al. | 204/2.1 |
| 4,445,965 | 5/1984 | Milnes | 156/624 |

FOREIGN PATENT DOCUMENTS

| | | | |
|---|---|---|---|
| EP80342 | 2/1982 | European Pat. Off. | 136/258 |
| EP45195 | 6/1983 | European Pat. Off. | 136/260 |
| 48-88027 | 11/1973 | Japan | 357/30 |
| 49-73686 | 7/1974 | Japan | 357/30 |

OTHER PUBLICATIONS

R. Radojcic et al., *Solar Cells*, vol. 4, pp. 101–107 (1981).
T. Chikamura, "Spectral Response of ZnSe-Zn$_{1-x}$Cd$_x$Te Heterojunction", *J. Appl. Phys.* 53(7), Jul. 1982, pp. 5146–5153.
S. L. Bell et al., "Growth and Characterization of Cadmium Zinc Telluride", presented at the *IRIS Detector Specialty Group Meeting*, Boulder, Co., Aug., 1983.
T. W. James et al., "Blocking of Threading Dislocations by Hg$_{1-x}$CD$_x$TE Epitaxial Layers", submitted to A.P.L., Aug., 1983.
Timothy W. James et al., "The Influence of Growth Conditions on the Interfacial Dislocation Structure of LPE Hg$_{1-x}$Cd$_x$Te", presented at *IRIS Detector Specialty Group Meeting*, Boulder, Co. (Aug. 1983).
Hendrik J. Gerritsen, "Electrochemical Deposition of Photosensitive CdTe and ZnTe on Tellurium", *Journal of the Electrochemistry Society*, Jan. 1984, pp. 136–140.
Fahrenbruch et al., "Recent Investigations of Metal Oxide/CdTe Heterojunction Solar Cells", *13th IEEE Photovoltaic Conf.*, Jun., 1978, pp. 281–287.
Fahrenbruch et al., "Photovoltaic Heterojunctions for Solar Energy Conversion", *11th IEEE Photovoltaic Conf.*, May, 1975, pp. 490–496.
Fahrenbruch et al., "II-VI Photovoltaic Heterojunctions for Solar Energy Conversion", *Appl. Physics*, vol. 25, No. 10, Nov. 1974, pp. 605–608.
Buch et al., "Photovoltaic Properties of n-CdSe/p-ZnTe Heterojunctions", *Appl. Physics Letters*, vol. 28, No. 10, May 1976, pp. 593–595.

(List continued on next page.)

Primary Examiner—Aaron Weisstuch
Attorney, Agent, or Firm—Lowe, King, Price & Becker

[57] ABSTRACT

A photovoltaic cell includes doped cadmium telluride formed of tetrahedral crystalline host semiconductor material including cadmium and telluride atoms bonded by ionic, covalent, and metallic forces. The host material is alloyed with Group II or VI atoms that replace either some of the host material cadmium or telluride atoms so that the alloyed and host atoms are bonded by at least covalent and metallic forces. The alloyed atoms have bond lengths with the nearest neighboring host atoms that are less than the host bond lengths. The number of bonded alloyed atoms is such that they do not substantially affect electronic conduction properties of the host material and result in a semiconductor region having no more than a few dislocations. A semiconductor of opposite conductivity to the conductivity type of the semiconductor region forms a junction with the region. At least one metal electrode makes ohmic contact with the first region. If the cadmium telluride is p type, the alloyed atoms are selected from the group consisting essentially of zinc, sulphur, and selenum, in which case the n type semiconductor can be cadmium sulphide. The n and p type semiconductors can be of the same compound to form a homojunction.

17 Claims, 4 Drawing Figures

OTHER PUBLICATIONS

Aranovich, et al., "ZnO Films and ZnO/CdTe Heterojunctions Prepared Using Spray Pyrolysis", *14th IEEE Photovoltaic Conf.*, San Diego, Calif., Jun. 1980, pp. 633, 634.

Yin et al., "Photovoltaic Properties of ZnCdS/CdTe Heterojunctions Prepared by Spray Pyrolysis", *J. Appl. Phys.* 49(3), Mar. 1978, pp. 1294-1296.

Serreze et al., "Spray Pyrolysis Prepared CdTe Solar Cells", *15th IEEE Photovoltaic Conf.*, Kissimmee, Fla., May 1981, pp. 1068-1072.

Aranovich et al., "Photovoltaic Properties of ZnO/CdTe Heterojunctions Prepared by Spray Pyrolysis", *J. Appl. Phys.* 51(8), Aug. 1980, pp. 4260-4268.

Fahrenbruch et al., "Recent Results on II-VI Heterojunctions for Photovoltaic Solar Energy Conversion", 12th IEEE Conf., Nov. 1976, pp. 529-533.

Jaeger et al., "Transition Resistances of Ohmic Contacts to p-Type CdTe and Their Time-Dependent Variation", Journ. of Electronic Materials, vol. 10, No. 3, 1981, pp. 605-618.

Bube et al., "Photovoltaic Energy Conversion with n-CdS-p-CdTe Heterojunctions and Other II-VI Junctions", IEEE Transactions on Electron Devices, vol. ED-24, No. 4, Apr. 1977, pp. 487-492.

*Chem. Abstracts*, vol. 95 (1981) Abstracts 222881p; 222882q; 222883r.

*Chem. Abstracts*, vol. 92 (1980) Abstract 61712e.

Razykov, T. M. et al., "Photovoltaic Effect in Heterojunctions Made of Zinc and Cadmium Tellurides", *Sov. Phys. Semicond.* 17(5), May 1983, pp. 585-586.

PHOTOVOLTAIC CELL INCLUDING DOPED CADMIUM TELLURIDE, A DISLOCATION PREVENTING AGENT AND IMPROVED OHMIC CONTACTS

TECHNICAL FIELD

The present invention relates generally to photovoltaic cells and more particularly to a photovoltaic cell including a doped cadmium telluride semiconductor that is alloyed with atoms forming bonds having lengths with the nearest neighboring cadmium telluride atoms to minimize dislocations, in combination with metal electrode means making ohmic contact with the thus formed semiconductor.

BACKGROUND ART

Photovoltaic solar cells generally include a first doped semiconductor that forms a junction with a second semiconductor. The first and second semiconductors are oppositely doped, so one is p doped and the other is n doped. The first and second semiconductors can be the same compounds or element which form a homojunction, or can be different semiconductors which form a heterojunction. The heterojunction devices have layers with different band gaps, and therefore different band pass characteristics, to enable the photovoltaic cell to be responsive only to certain wavelengths from an optical source.

One particularly advantageous type of photovoltaic cell, particularly adapted for solar cell applications, includes semiconductors of the Group II-VI type, particularly CdTe. Cadmium telluride-cadmium sulphide heterojunctions have been found to be particularly advantageous because CdS has a much wider band gap than CdTe, thereby enabling coupling of wide band optical energy to the junction. Such heterojunctions require the cadmium telluride to be p doped because cadmium sulphide can only be n doped. Homojunction cadmium telluride photovoltaic cells, i.e., cells wherein the junction is formed by oppositely doped CdTe regions, are also advantageous.

Cadmium telluride photovoltaic cells can take many forms. In one form, the cadmium telluride forms a substrate on which is deposited cadmium sulphide to form a mesa junction or on which cadmium sulphide is epitaxially deposited. In a second form, the cadmium telluride is a thin film coated on a ceramic substrate and the cadmium sulphide is a thin film that is coated, in some instances in an epitaxial manner, on the cadmium telluride. Alternatively, the cadmium sulphide is deposited on an optically transparent, glass substrate and a cadmium telluride film is formed on the cadmium sulphide deposit, e.g. by vapor deposition. In another configuration, the cadmium telluride is coated on a metal electrode block and cadmium sulphide is deposited on the cadmium telluride.

One problem with all of the prior art forms of cadmium telluride photovoltaic solar cells is that metal electrodes make poor ohmic contact with the cadmium telluride. The contact problem has been sufficiently great to materially reduce the yield and stability of previously fabricated cadmium telluride solar cells; thus contacts on previously manufactured CdTe solar cells have had a tendency to deteriorate with time. The exploitation of cadmium telluride solar cells has thus been reduced, even though such cells exhibit a relatively high solar efficiency of 10 percent, before contact degradation.

It is, accordingly, an object of the present invention to provide a new and improved cadmium telluride photovoltaic cell.

Another object of the invention is to provide a new and improved cadmium telluride photovoltaic cell having improved ohmic contact characteristics.

Still another object of the present invention is to provide a new and improved cadmium telluride-cadmium sulphide photovoltaic solar cell having improved ohmic contact characteristics.

A further object of the present invention is to provide a new and improved cadmium telluride homojunction photovoltaic cell having improved ohmic contact characteristics.

DISCLOSURE OF INVENTION

In accordance with the present invention, we have found that the contact problem with prior cadmium telluride photovoltaic cells is due to a high dislocation density in the cadmium telluride. The dislocation density of cadmium telluride is improved in accordance with the present invention by alloying the cadmium telluride host material with a single type of atoms that replace either some of the cadmium or some of the telluride atoms of the host material so that the alloyed and host atoms are bonded by at least covalent and metallic forces. As disclosed in the copending commonly assigned application, Ser. No. 576,728, filed Feb. 2, 1984 of Arden Sher entitled "Integrated Circuit Having Dislocation Free Substrate", the dislocation density is reduced if the alloyed atoms have a bond length with the nearest neighboring host atoms that is less than the bond length between the nearest neighboring host atoms. The number of bonded alloyed atoms is small compared to the number of bonded host atoms so as not to substantially affect electron conduction and optical absorption properties of the host cadmium telluride. Thereby, a cadmium telluride semiconductor region doped with carriers of a first polarity and having no more than a few dislocations is formed. A second semiconductor doped with carriers of a second polarity forms a junction with the region having the first polarity. A metal electrode means makes ohmic contact with the region having the first carriers.

If the second semiconductor is cadmium sulphide, which must be n doped, the cadmium telluride is p doped. In such a situation, the single type of atoms that replace some of the cadmium or some of the tellurium atoms of the host material is selected from the group consisting essentially of zinc, sulphur, and selenium, whereby the p type semiconductor is respectively $Cd_{1-x}Zn_xTe$, $CdTe_{1-y}S_y$, and $CdTe_{1-y}Se_y$, where both x and y are in the range from 0.02 to 0.5. If x exceeds 0.5, the conversion efficiency of the photovoltaic solar cell is significantly reduced relative to that of cadmium telluride without the addition of a dislocation suppression agent. If x=0.5 and zinc is the dislocation suppression agent, the resulting $Cd_{0.5}Zn_{0.5}Te$ has a band gap of 1.9 eV, in contrast to a band gap of 1.44 eV for CdTe.

Because superior ohmic contacts can be applied to the cadmium telluride semiconductors in accordance with the invention, stable cadmium telluride homojunction solar cells can be formed. For example, it is possible in accordance with the invention to form homojunctions having the formula $$p\text{-}Cd_{1-x}Zn_xTe/n\text{-}Cd_{1-x}Zn_xTe,$$

or $$p\text{-}CdTe_{1-y}S_y/n\text{-}CdTe_{1-y}S_y/n\text{-}CdTe_{1-y}S_y,$$

or $$p\text{-}CdTe_{1-y}Se_y/n\text{-}CdTe_{1-y}Se_y,$$

where x and y are in the range from 0.02 to 0.5.

In accordance with a further aspect the invention, the $CdTe_{1-y}S_y$ and $CdTe_{1-y}Se_y$ can be either p doped or n doped to form heterojunctions with oppositely doped semiconductors having band gap properties different from those of $CdTe_{1-y}S_y$ and $CdTe_{1-y}Se_y$. For example, the wide band gap material zinc selenide or other wider band gap n type semiconductors can be combined with $CdTe_{1-y}S_y$ or $CdTe_{1-y}Se_y$ to form a junction for converting optical energy into electrical energy.

In accordance with a further aspect of the invention the host can be alloyed with two atoms. In such an event the photovoltaic cell comprises a doped CdTe semiconductor formed of tetrahedral structural crystalline host semiconductor material including Cd and Te atoms bonded by ionic, covalent, and metallic forces. The CdTe host material is alloyed with Group II and Group VI atoms that replace some of the Cd and some of the Te atoms of the host material so that the alloyed and host atoms are bonded by at least covalent and metallic forces. The alloyed atoms have a bond length with the nearest neighboring host atoms that is less than the known host bond length. The number of bonded alloyed atoms is small compared to the number of bonded host atoms so as not to substantially affect electron conduction and optical properties of the host material. Thereby a semiconductor volume of a first conductivity type and having no more than a few dislocations is formed. A semiconductor region of the second conductivity type forms a junction with the volume of the first conductivity type. Metal electrode means make ohmic contact with the volume of the first conductivity type.

In such a photovoltaic cell, Group II atoms are preferably Zn and the Group VI atoms are preferably selected from the group consisting essentially of S and Se. Thereby the first conductivity type semiconductor volume is selected from the group consisting essentially of $$Cd_{1-x}Zn_xTe_{1-y}Se_y$$

and $$Cd_{1-x}Zn_xTe_{1-y}S_y,$$

where $0.02 \leq (x+y) \leq 0.5$, $x>0$, $y>0$. The first and second semiconductor compounds can differ from each other to form a heterojunction or they can be the same to form a homojunction.

It is, accordingly a further object of the invention to provide a new and improved cadmium telluride photovoltaic solar cell wherein a cadmium telluride compound has low dislocation density and good, stable ohmic contacts.

The above and still further objects, features and advantages of the present invention will become apparent upon consideration of the following detailed description of several specific embodiments thereof, especially when taken in conjunction with the accompanying drawings.

BEST MODE FOR CARRYING OUT THE INVENTION

Figure 1:
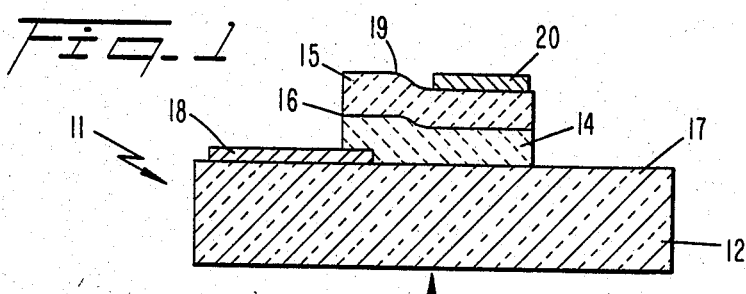
FIG. 1 is a schematic view of a first embodiment of the invention wherein a CdTe solar cell is formed on a glass substrate.

Reference is now made to FIG. 1 of the drawing wherein solar cell 11 is illustrated as including ceramic or glass substrate 12 that is transparent to optical energy, indicated by arrow 13. Deposited on substrate 12 are layers 14 and 15 which form p-n junction 16; layer 15 is a CdTe compound. At the interface between substrate 12 and layer 14, which is deposited directly on face 17 of substrate 12, is metal electrode 18. Deposited on face 19 of layer 15 remote from substrate 12 is electrode 20, which makes ohmic contact with layer 15. Electrode 18 makes ohmic contact with layer 14.

Junction 16 can be a homojunction or a heterojunction. If layers 14 and 15 are the same CdTe compounds, but are oppositely doped, junction 16 is a homojunction. In contrast, if oppositely doped layers 14 and 15 are formed of different compounds, junction 16 is a heterojunction. If junction 16 is a heterojunction, layer 14 is preferably cadmium sulphide, a compound having a band gap that is large compared to the band gap of the CdTe compound in layer 15, to enable optical energy 13 to impinge on the junction and enable charged carriers to migrate to electrodes 18 and 20.

Cadmium telluride semiconductor layer 15 is formed as a tetrahedral crystalline host semiconductor material wherein the cadmium and telluride atoms of the semiconductor are bonded by ionic, covalent, and metallic forces. The nearest cadmium and tellurium atoms of layer 15 have known bond lengths of 2.805 and 2.807 Angstroms in zinc blende and Wurtzite configurations, respectively. The cadmium telluride host material is alloyed with a single type of atoms that replace some of the cadmium or some of the telluride atoms of layer 15 so that alloyed and host atoms are bonded by at least covalent and metallic forces. The alloyed atoms have a bond length with the nearest neighboring host atoms that is less than the known host bond length. The number of bonded alloyed atoms in layer 15 is small compared to the number of bonded host atoms in the layer so as not to substantially affect electron conduction and optical properties of the cadmium telluride crystals in layer 15. Because the alloyed atoms have a bond length with the nearest neighboring host atoms that is less than the bond length between the cadmium and tellurium in layer 15, there is a substantial reduction in the CdTe dislocation density, i.e., there are no more than a few dislocations in layer 15. Thereby, good contact properties subsist between ohmic contact 20 and layer 15.

In one preferred embodiment, layer 14 is cadmium sulphide, a wide band material that can only be n doped. In such a situation, layer 15 must be p doped.

To provide the virtually dislocation free characteristics of layer 15, some of the cadmium or telluride atoms in layer 15 are replaced either by zinc, sulphur or selenium atoms. Addition of zinc, sulphur and selenium to the p type cadmium telluride results in formation of $Cd_{1-x}Zn_xTe$, $CdTe_{1-y}S_y$ and $CdTe_{1-y}Se_y$, respectively; wherein x and y are in the range from 0.02 to 0.5. If the value of x or y is less than 0.02, the number of dislocations in the cadmium telluride is not sufficiently reduced. If the value of x or y is greater than 0.5, the band gap of the cadmium telluride is materially increased, resulting in a significant reduction in the efficiency of the cell in converting solar energy into electric energy.

To alloy zinc into the cadmium telluride, atoms of zinc telluride are added to the host cadmium telluride. A significant reduction in the cadmium telluride dislocation density occurs by such an alloying process because cadmium telluride has a bond length distance of 2.805 and 2.807 for the zinc blende and Wurtzite crystalline structures, respectively, in contrast to the bonding distance of 2.643 Angstroms and 2.659 Angstroms for zinc telluride in the zinc blende and Wurtzite configurations. Sulphur is alloyed into cadmium telluride by adding cadmium sulphide to cadmium telluride, which results in a reduction in the cadmium telluride dislocation density because the bond length of cadmium sulphide for the zinc blende Wurtzite configurations is 2.527 Angstroms and 2.518 Angstroms, respectively. Thus, the bond length of cadmium sulphide is appreciably less than that of cadmium telluride. To alloy selenium into cadmium telluride, cadmium selenium is added to the cadmium telluride, which results in a reduction in the cadmium telluride dislocation density because the bond lengths of cadmium selenide for the zinc blende and Wurtzite configurations is 2.62 Angstroms and 2.63 Angstroms, respectively.

It is to be understood that layer 14 can also be the same cadmium telluride compound as layer 15, with layer 14 being oppositely doped relative to layer 15. A homojunction is thereby formed of any of the three previously mentioned cadmium telluride compounds. Electrode 18 can be transparent to optical energy propagating through glass substrate 12, in which case electrode 18 can have an area which prevents contact between layer 14 and substrate 12. If layers 14 and 15 have significant area, it may be desirable for electrodes 18 and 20 to be segmented and extend over appreciable portions of the area of the semiconductor layers.

Figure 2:
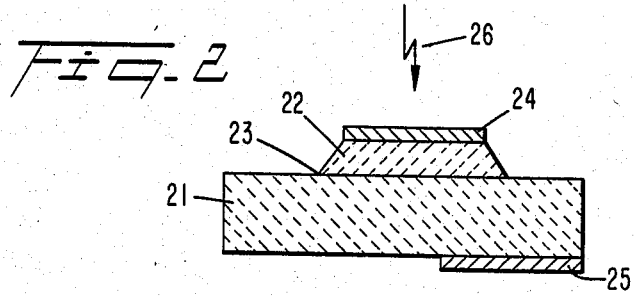
FIG. 2 is a schematic view of a second embodiment of the invention wherein a CdTe solar cell is formed as a mesa configuration.

In certain situations it is desirable to epitaxially deposit layer 15 onto layer 14. In such an situation, layer 15 is a thin film layer having a thickness in the range of 0.5 to 25 microns. The configuration of FIG. 1 can be reversed whereby optical energy is incident on layer 15. In such a case layer 15 has a band gap equal to or greater than that of layer 14, and layer 14 is a CdTe compound. If layer 14 is a p-CdTe compound, layer Reference is now made to FIG. 2 of the drawing wherein the invention is illustrated in a mesa configuration including semiconductor substrate 21 on which is deposited mesa layer 22. Substrate 21 and layer 22 can be any of the previously mentioned materials specified for layers 14 and 15 of FIG. 1. Junction 23 subsists between substrate 21 and layer 22. Thus, junction 23 can either be a homojunction or a heterojunction. If junction 23 is a heterojunction, substrate 21 is one of three previously mentioned cadmium telluride compounds, in bulk material form. If mesa layer 22 is cadmium sulphide, substrate 21 is p doped, and is preferably $Cd_{1-x}Zn_xTe$. If substrate 21 is n type $CdTe_{1-y}S_y$ or $CdTe_{1-y}Se_y$, layer 22 can be the wide band gap p type material zinc selenide.

Electrodes 24 and 25 are respectively deposited on the top and bottom faces of layer 22 and substrate 21. Electrode 25 makes ohmic contact with substrate 21. Good adherence exists between electrode 25 and substrate 21 because of the low dislocation density of substrate 21. Electrode 24 makes good ohmic contact with layer 22, even if the layer is formed of a cadmium telluride compound because the cadmium telluride compound is alloyed with a dislocation suppression agent, as discussed supra. Electrode 24 is transparent so that optical energy incident thereon, as indicated by arrow 26, can propagate through the electrode. Layer 22 is a thin film layer having a wide band gap and therefore sufficient transparency to enable optical energy 26 to reach junction 23.

Figure 3:
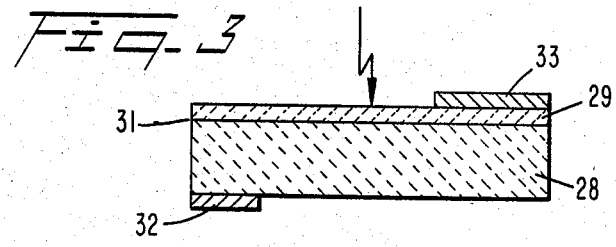
FIG. 3 is a schematic view of a further embodiment of the invention wherein a solar cell is formed by epitaxial deposition of a semiconductor layer onto a substrate.

The invention can also be incorporated into a structure wherein one of the three cadmium telluride compounds forms substrate 28, on which epitaxial, thin film layer 29 is deposited, as illustrated in FIG. 3. In such a configuration, thin film epitaxially deposited layer 29 is the same compound as substrate 28 but of opposite conductivity type to the substrate to form junction 31 as a homojunction; alternatively, layer 29 and substrate 28 have opposite conductivity type and are different compounds so junction 31 is a heterojunction. For a CdTe homojunction structure ohmic contacts 32 and 33 are formed on the exposed, opposite faces of substrate 28 and layer 29. For a heterojunction, electrode 32 makes ohmic contact with CdTe substrate 28 while electrode 33 makes ohmic contact with layer 29. The electrodes making ohmic contact with the three cadmium telluride semiconductor compounds are typically aluminum for n-type material and nickel or gold for p-type.

Figure 4:
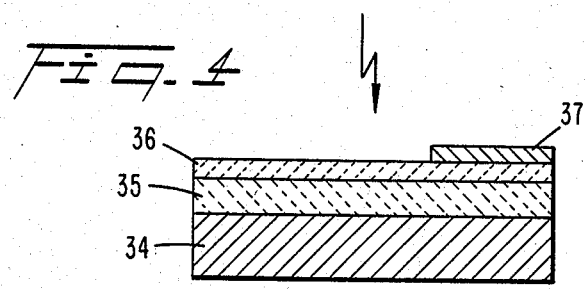
FIG. 4 is a schematic view of another embodiment of the invention wherein CdTe is deposited on a metal electrode block.

The invention can also be configured in the manner illustrated in FIG. 4 wherein one of the three cadmium telluride compounds is deposited as layer 35 on metal contact block 34 which forms an electrode for the photovoltaic cell. Ohmic contact is made between layer 35 and block 34 by using conventional deposition techniques for depositing the cadmium telluride compound of layer 35 on block 34. Deposited on layer 35 is a further layer 36 that can be cadmium sulphide or the identical cadmium telluride compound of layer 35. Electrode 37 is deposited on the face of layer 36 which is opposite to metal block 34.

The present invention enables the known advantages of cadmium telluride type solar cells, as discussed by Bube et al, *IEEE Transactions Electronic Devices*, ED-24, page 487 (1977) and in the book entitled "Physics of Semiconductor Devices", 2nd Edition, Sze, John Wiley and Sons, pages 797 and 798, to be achieved without the contact problem which Bube recognized. Because cadmium telluride has nearly the theoretically ideal band gap for a solar cell, there has been no prior interest in adjusting the band gap of solar cells fabricated of cadmium telluride. We realize that adding zinc, sulphur, and selenium to cadmium telluride shifts the band gap of the cadmium telluride to a higher energy level, which is opposite to the desired direction. However, the addition of zinc, sulphur, or selenium, in the specified amounts, results in only a slight shift in the band gap of the cadmium telluride. For example, if zinc is added to cadmium telluride to form $Cd_{0.9}Zn_{0.1}Te$, there is a shift of the CdTe band gap from 1.44 electron volts to 1.52 electron volts. If zinc is added to the cadmium telluride so that there are equal amounts of cadmium and zinc in the compound, to form $Cd_{0.5}Zn_{0.5}Te$, there is a shift of the band gap from 1.44 electron volts to 1.85 electron volts, which is probably the outer tolerable limit for effective operation of cadmium telluride photovoltaic solar cells. The compromise between dislocation density reduction and increased band gap is tolerable to this limit.

The invention is also applicable to n or p doped CdTe semiconductors that are alloyed with two atoms to form crystals having shorter bonding lengths than those of the CdTe host. The alloyed atoms are selected from Groups II and VI of the Periodic Table to replace some cadmium and tellurium atoms of the host. Zinc is alloyed by adding ZnTe to the host, while sulphur or selenium are alloyed by respectively adding CdS or CdSe to the CdTe host. As indicated supra, ZnTe, CdS, and CdSe all have bond lengths considerably less than that of CdTe. The resulting CdTe host is thus modified to be $Cd_{1-x}Zn_xTe_{1-y}S_y$ or $Cd_{1-x}Zn_xTe_{1-y}Se_y$. To provide the desired low dislocation density without affecting optical and electron conduction properties, $0.02 \leq (x+y) \leq 0.5$, $x > 0$, $y > 0$.

In the foregoing specification and the following claims the clause "single type of atoms" has reference to atoms from the same column of the periodic table. Thus, sulfur and selenium are a single type of atoms because they are both in column VI of the periodic table.

While there have been described and illustrated several specific embodiments of the invention, it will be clear that variations in the details of the embodiments specifically illustrated and described may be made without departing from the true spirit and scope of the invention as defined in the appended claims.

We claim:

1. A photovoltaic cell comprising a p type CdTe semiconductor formed of tetrahedral structural crystalline host semiconductor material including Cd and Te atoms bonded by ionic, covalent and metallic forces, the nearest Cd and Te atoms of the host material having a known bond length, the CdTe host material being alloyed with a single type of atoms that replace about 0.1 of either some of the Cd or some of the Te atoms of the host material so that the alloyed and host atoms are bonded by at least covalent and metallic forces, the alloyed atoms having a bond length with the nearest neighboring host atoms that is less than the known host bond length, the number of bonded alloyed atoms being small compared to the number of bonded host atoms so as not to substantially affect electron conduction and optical properties of the host material, whereby a p type semiconductor region having low dislocation density relative to the dislocation density of the CdTe is formed, an n type semiconductor forming a junction with the p type region, and separate first and second metal electrode means respectively making ohmic contacts with the low dislocation density p type region and the n type region.

2. The photovoltaic cell of claim 1 wherein the single type of atoms is selected from the group consisting essentially of Zn, S, and Se, whereby the p type semiconductor is respectively $Cd_{1-x}Zn_xTe$, $CdTe_{1-y}S_y$, and $CdTe_{1-y}Se_y$, where x is about 0.1 and y is about 0.1.

3. The photovoltaic cell of claim 2 wherein the n type semiconductor is a compound different from the p type semiconductor, whereby a heterojunction is formed by the p and n type semiconductors.

4. The photovoltaic cell of claim 3 wherein the n type region has a band gap greater than the band gap of the p type region, the n type region being substantially transparent to a first band of optical energy that includes a second band of optical energy to which the p type region is responsive, the p type region being adapted to be positioned to be responsive to optical energy.

5. The photovoltaic cell of claim 4 wherein the n type semiconductor is CdS.

6. The photovoltaic cell of claim 4 wherein the n type semiconductor is a thin film of CdS epitaxially deposited on the p type material.

7. The photovoltaic cell of claim 2 wherein the p and n type semiconductors are compounds having the same formula, whereby the p and n type semiconductors both have low dislocation density relative to the dislocation density of the CdTe, and the second electrode means makes contact with the low dislocation density n type semiconductor, and a homojunction is formed by the p and n type semiconductors.

8. The photovoltaic cell of claim 1 whereby the p type region is a bulk material.

9. The photovoltaic cell of claim 1 further including a ceramic substrate and wherein the p type region is a thin film on the ceramic substrate.

10. A photovoltaic cell comprising a p type CdTe semiconductor formed of tetrahedral structural crystalline host semiconductor material including Cd and Te atoms bonded by ionic, covalent and metallic forces, the nearest Cd and Te atoms of the host material having a known bond length, the CdTe host material being alloyed with atoms selected from the group consisting essentially of Se and S that replace about 0.1 of the Te atoms of the host material so that the alloyed and host atoms are bonded by at least covalent and metallic forces, the alloyed atoms having a bond length with the nearest neighboring host atoms that is less than the known host bond length, the number of bonded alloyed atoms being small compared to the number of bonded host atoms so as not to substantially affect electron conduction and optical properties of the host material, whereby a p type semiconductor volume having low dislocation density relative to the dislocation density of CdTe is formed, an n type semiconductor region forming a junction with the volume of the p type semiconductor, and first and second metal electrode means respectively making separate ohmic contacts with the volumes of the low dislocation density p type semiconductor and the n type semiconductor.

11. The photovoltaic cell of claim 10 wherein the p type semiconductor is selected from the group consisting essentially of $$CdTe_{1-y}S_y$$

and $$CdTe_{1-y}Se_y,$$

where y is about 0.1.

12. The photovoltaic cell of claim 11 wherein the p and n type semiconductors are different compounds.

13. The photovoltaic cell of claim 11 wherein the p and n type semiconductors are the same compounds, whereby both semiconductors have low dislocation density relative to the dislocation density of the CdTe, and the second electrode means makes ohmic contact with the low dislocation density n type semiconductor, and a homojunction is formed by the p and n type semiconductors.

14. A photovoltaic cell comprising a p type CdTe semiconductor formed of tetrahedral structural crystalline host semiconductor material including Cd and Te atoms bonded by ionic, covalent and metallic forces, the nearest Cd and Te atoms of the host material having a known bond length, the CdTe host material being alloyed with Group II and Group VI atoms that replace a total of about 0.1 of the Cd and Te atoms of the host material so that the alloyed and host atoms are bonded by at least covalent and metallic forces, the alloyed atoms having a bond length with the nearest neighboring host atoms that is less than the known host bond length, the number of bonded alloyed atoms being small compared to the number of bonded host atoms so as not to substantially affect electron conduction and optical properties of the host material, whereby a p type semiconductor volume having a low dislocation density relative to the dislocation density of the CdTe is formed, an n type semiconductor region forming a junction with the volume of the p type semiconductor, and first and second metal electrode means respectively making separate ohmic contacts with the volumes of the low dislocation density p type semiconductor and the n type semiconductor.

15. The photovoltaic cell of claim 14 wherein the Group II atoms are Zn and the Group VI atoms are selected from the group consisting essentially of S and Se, whereby the p type semiconductor volume is selected from the group consisting essentially of $$Cd_{1-x}Zn_xTe_{1-y}Se_y$$

and $$Cd_{1-x}Zn_xTe_{1-y}S_y,$$

where x+y is about 0.1.

16. The photovoltaic cell of claim 14 wherein the p and n type semiconductors differ from each other, whereby a heterojunction is formed by them.

17. The photovoltaic cell of claim 14 wherein the p and n type semiconductors are the same compounds.

* * * * *